(12) United States Patent
Chen et al.

(10) Patent No.: US 7,274,636 B2
(45) Date of Patent: Sep. 25, 2007

(54) PHASE LOCKED LOOP FOR GENERATING AN OUTPUT SIGNAL

(75) Inventors: Hong-Ching Chen, Kao-Hsiung Hsien (TW); Wen-Yi Wu, Hsin-Chu Hsien (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 436 days.

(21) Appl. No.: 10/905,132

(22) Filed: Dec. 17, 2004

(65) Prior Publication Data
US 2005/0190671 A1   Sep. 1, 2005

(30) Foreign Application Priority Data
Feb. 26, 2004   (TW) .............................. 93105008 A

(51) Int. Cl.
*G11B 7/00*   (2006.01)
(52) U.S. Cl. ................................. 369/47.28; 369/44.27
(58) Field of Classification Search ............. 369/44.27, 369/44.28
See application file for complete search history.

(56) References Cited

U.S. PATENT DOCUMENTS

| | | | |
|---|---|---|---|
| 4,642,573 A * | 2/1987 | Noda et al. .................. 329/308 |
| 5,657,309 A * | 8/1997 | Ebisawa et al. .......... 369/47.19 |
| 5,663,941 A * | 9/1997 | Aoshima .................. 369/44.34 |
| 5,737,694 A * | 4/1998 | McMahill et al. ............. 455/76 |
| 5,857,004 A * | 1/1999 | Abe ............................ 375/344 |
| 6,157,263 A | 12/2000 | Lee |
| 6,262,955 B1 * | 7/2001 | Kim ......................... 369/44.41 |
| 6,345,018 B1 * | 2/2002 | Maegawa et al. ......... 369/44.13 |
| 6,693,860 B1 * | 2/2004 | Fischer ..................... 369/44.26 |
| 6,781,469 B2 | 8/2004 | Ho |

FOREIGN PATENT DOCUMENTS

| | | |
|---|---|---|
| TW | 421922 | 2/2001 |
| TW | 573400 | 1/2004 |

* cited by examiner

*Primary Examiner*—Wayne Young
*Assistant Examiner*—Van T. Pham
(74) *Attorney, Agent, or Firm*—Winston Hsu

(57) ABSTRACT

A phase locked loop (PLL) for generating an output signal according to an input signal is disclosed. The PLL of the present invention includes a detector for generating a detection signal according to the logical difference between the input signal and a feedback signal, a signal mixer electrically connected to the detector for generating a control signal according to the detection signal and a mixing reference signal, a filtering device electrically connected to the signal mixer for generating an adjust signal according to the control signal, a controllable oscillator electrically connected to the filtering device for generating the output signal according to the adjust signal, and a frequency divider electrically connected to the controllable oscillator for generating the feedback signal and the mixing reference signal according to the output signal. The frequency of the output signal is at least twice the frequency of the input signal.

24 Claims, 19 Drawing Sheets

| Type_sel | Ud | Mix_clk | Up_mix | Dn_mix |
|---|---|---|---|---|
| 0 | 0 | X | 0 | 1 |
| 0 | 1 | X | 1 | 0 |
| 1 | 0 | 0 | 0 | 1 |
| 1 | 0 | 1 | 0 | 0 |
| 1 | 1 | 0 | 0 | 0 |
| 1 | 1 | 1 | 1 | 0 |

X: Don't care

Fig. 14

PHASE LOCKED LOOP FOR GENERATING AN OUTPUT SIGNAL

BACKGROUND

The present invention relates to a phase-locked loop (PLL), and more particularly, to a PLL for generating an output signal according to an input signal, wherein the frequency of the output signal is at least twice of the frequency of the input signal.

Phase-locked loop (PLL) has many applications, such as clock/data recovery, frequency or phase modulation/demodulation, and generating clocks with stable frequency so that PLLs are widely applied in various electronic devices, consumer products, and communication devices. In general, a conventional PLL comprises a phase frequency detector (PFD) for detecting phase error and frequency error between an input signal and a feedback signal, and a loop filter for adjusting the operation of a VCO according to the detection result of the PFD until the frequency and phase of the feedback signal match that of the input signal.

In a conventional recordable optical disk drive, for example, a PLL is used to generate a write clock according to a wobble signal. Generally, the conventional recordable optical disk drive utilizes a pick-up head to emit a laser beam to the wobbled groove on a recordable optical disk. Then, the pick-up receives the signal reflected from the recordable optical disk, and a push-pull signal is extracted from the reflected signal. As is well known in the art, a level slicer and a band pass filter can be employed to extract a wobble signal, which corresponds to the physical address of the optical disk, from the push-pull signal. In DVD–R/RW format, a wobble period corresponds to 186 periods of the write clock. In DVD+R/RW format, a wobble period corresponds to 32 periods of the write clock. When writing data into the recordable optical disk, the conventional recordable optical disk drive typically uses one write clock period as a minimum length unit. Therefore, in order to write data into the correct track, the PLL is employed in the conventional recordable optical disk drive to synchronize the write clock and the wobble signal.

Please refer to FIG. 1, which shows a schematic diagram of a wobbled groove and a corresponding wobble signal according to the related art. In a DVD+R/RW disk, as is well known in the art, the address information is recorded in the wobbled groove with the phase changes of wobble. Accordingly, the wobble signal generated based on the wobbled groove also has some periods with phase-change. For example, when the phase of the wobbled groove is suddenly changed, it possibly generates some signal impulses 102, 104, 106, etc. as shown in FIG. 1.

However, since the PFD employed in the conventional PLL is very sensitive to the edges of the foregoing impulses, it easily operates incorrectly. Furthermore, noise of the wobble signal is also probably causes the PFD to operate incorrectly and thereby affects the performance of the PLL.

SUMMARY OF INVENTION

According to a preferred embodiment of the present invention, a PLL for generating an output signal according to an input signal is disclosed. The PLL of the present invention includes: a detector for generating a detection signal according to the difference of logical value between the input signal and a feedback signal; a signal mixer electrically connected to the detector for generating a control signal according to the detection signal and a mixing reference signal with the frequency higher than the feedback signal; a filtering device electrically connected to the signal mixer for generating an adjust signal according to the control signal; a controllable oscillator electrically connected to the filtering device for generating the output signal according to the adjust signal; and a frequency divider electrically connected to the controllable oscillator for generating the feedback signal and the mixing reference signal according to the output signal; wherein the frequency of output signal is at least twice the frequency of the input signal.

Another objective of the present invention is to provide an optical storage device for generating a writing clock according to a wobble signal. According to a preferred embodiment, the optical storage device of the present invention includes: a detector for generating a detection signal according to the difference of logical level between the wobble signal and a feedback signal; a signal mixer electrically connected to the detector for generating a control signal according to the detection signal and a mixing reference signal with a frequency higher than the feedback signal; a filtering device electrically connected to the signal mixer for generating an adjust signal according to the control signal; a controllable oscillator electrically connected to the filtering device for generating the writing clock according to the adjust signal; and a frequency divider electrically connected to the controllable oscillator for generating the feedback signal and the mixing reference signal according to the writing clock; wherein the writing clock is at least 32 times the frequency of the wobble signal.

BRIEF DESCRIPTION OF DRAWINGS

FIG. 14 is a truth table of a signal mixer of FIG. 13 according to the present invention.

DETAILED DESCRIPTION

For convenient description, a PLL of the present invention is assumed be employed in a DVD+R/RW recordable optical disk drive in the following illustrations.

Figure 1:
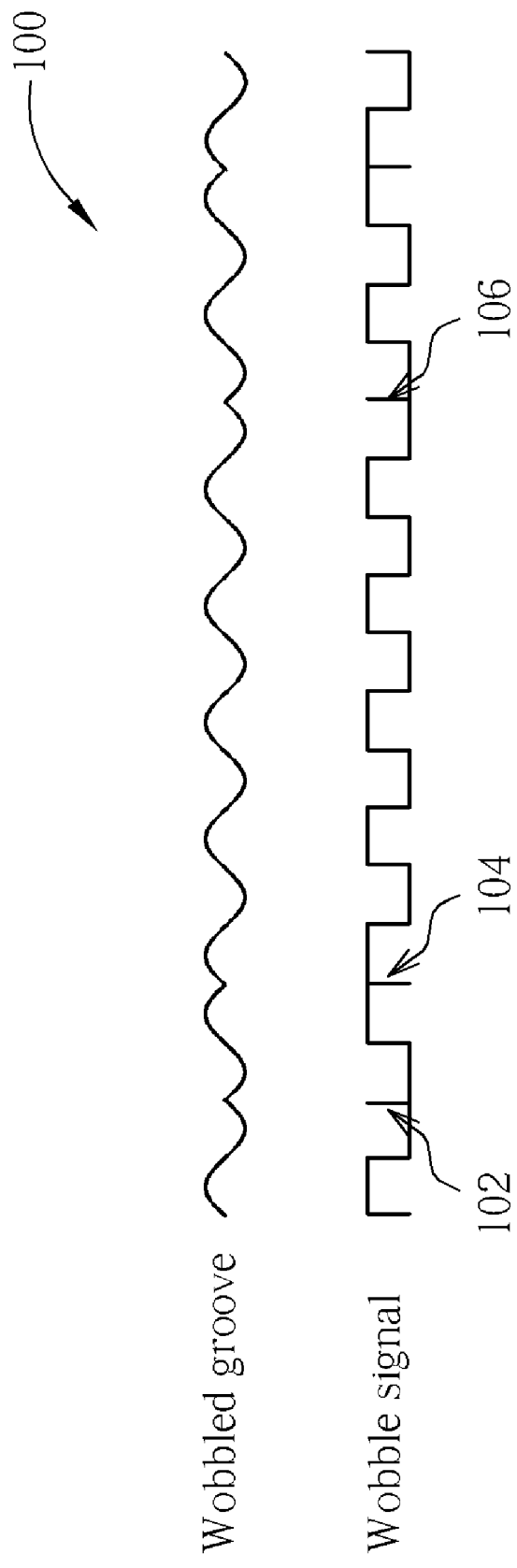
FIG. 1 is a schematic diagram of a wobbled groove and a corresponding wobble signal according to the related art.
Figure 2:
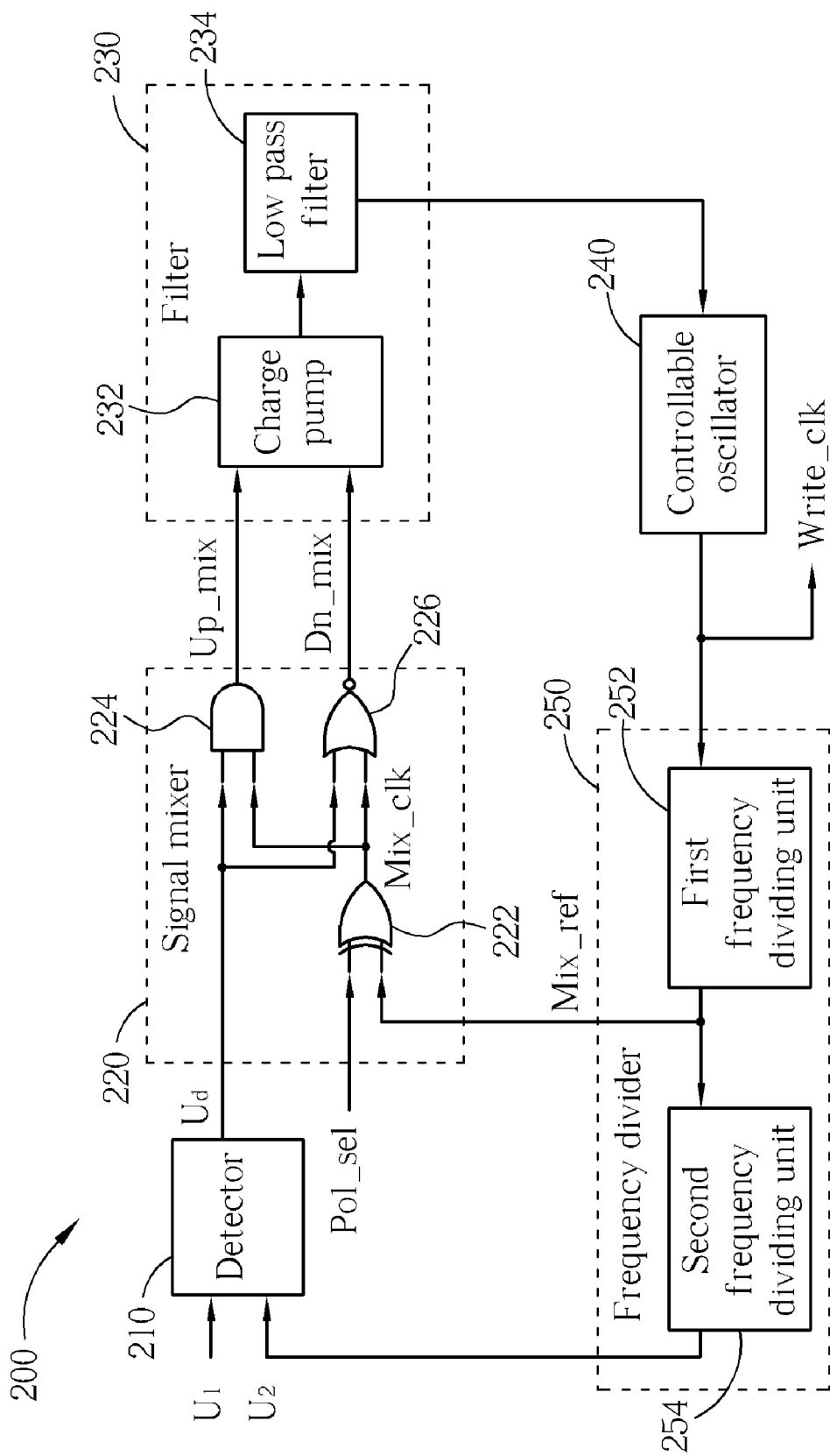
FIG. 2 is a schematic diagram of a PLL according to the first embodiment of the present invention.

Please refer to FIG. 2, which shows a schematic diagram of a PLL 200 according to the first embodiment of the present invention. The PLL 200 comprises a detector 210 for generating a detection signal $U_d$ according to the difference of logical value between a wobble signal $U_1$ and a feedback signal $U_2$; a signal mixer 220 electrically connected to the detector 210 for generating a control signal according to the detection signal $U_d$ and a mixing reference signal Mix_ref which is at least twice the frequency of the feedback signal $U_2$; a filter 230 electrically connected to the signal mixer 220 for generating an adjust signal according to the control signal; a controllable oscillator 240 electrically connected to the filter 230 for generating a write clock Write_clk according to the adjust signal; and a frequency divider 250 electrically connected to the controllable oscillator 240 for generating the feedback signal $U_2$ and the mixing reference signal Mix_ref according to the write clock Write_clk. In the recordable optical disk drive, the PLL 200 is used for generating the write clock Write_clk whose phase matches the phase of the wobble signal $U_1$, and has 32 times the frequency of the wobble signal $U_1$, so that the write clock Write_clk is employed as a bit clock when the recordable optical disk drive records data.

In a preferred embodiment, the frequency divider 250 is composed of a first frequency dividing unit 252 and a second frequency dividing unit 254. The first frequency dividing unit 252 is used for dividing the frequency of the write clock Write_clk by 16 to generate the mixing reference signal Mix_ref. The second frequency dividing unit 254 is used for dividing the frequency of the mixing reference signal Mix_ref by 2 to generate the feedback signal $U_2$. As a result, the frequency of the write clock Write_clk is 32 times the frequency of the feedback signal $U_2$, and the frequency of the mixing reference signal Mix_ref is twice the frequency of the feedback signal $U_2$.

In addition, in practical implementations, the controllable oscillator 240 can be a voltage control oscillator (VCO), a current control oscillator (ICO), or a digital oscillator and so on.

In general, the filter 230 comprises a charge pump 232 for generating the adjust signal according to the control signal in order to control the controllable oscillator 240 to adjust the frequency of the write clock Write_clk. The charge pump 232 typically comprises at least one charge/discharge switch and a capacitor. Additionally, in order to improve the signal quality of the write clock Write_clk, the filter 230 can utilize a low pass filter 234 to process the adjust signal to reduce the jitter within the write clock Write_clk caused by the ripper of the adjust signal.

As is well known in the art, the PLL 200 of the present invention can also utilize a frequency detector (not shown) to assist the operation of the detector 210 to improve the response speed of the PLL 200. Since the operation of the frequency detector is known in the art, further details are therefore omitted here.

In the PLL 200 of the present invention, the detector 210 generates the detection signal $U_d$ by performing an XOR logic operation on the wobble signal $U_1$ and the feedback signal $U_2$. In other words, when comparing the difference between the wobble signal $U_1$ and the feedback signal $U_2$, the detector 210 of the present invention responds to the difference of logic state between the two signals and does not respond to the edges of the two signals. Accordingly, the detector 210, for example, can be an XOR gate. In practice, other circuits or combination logic circuits, which are able to compare the difference between two input signals, should also be included in the embodiments of the present invention.

Figure 3:
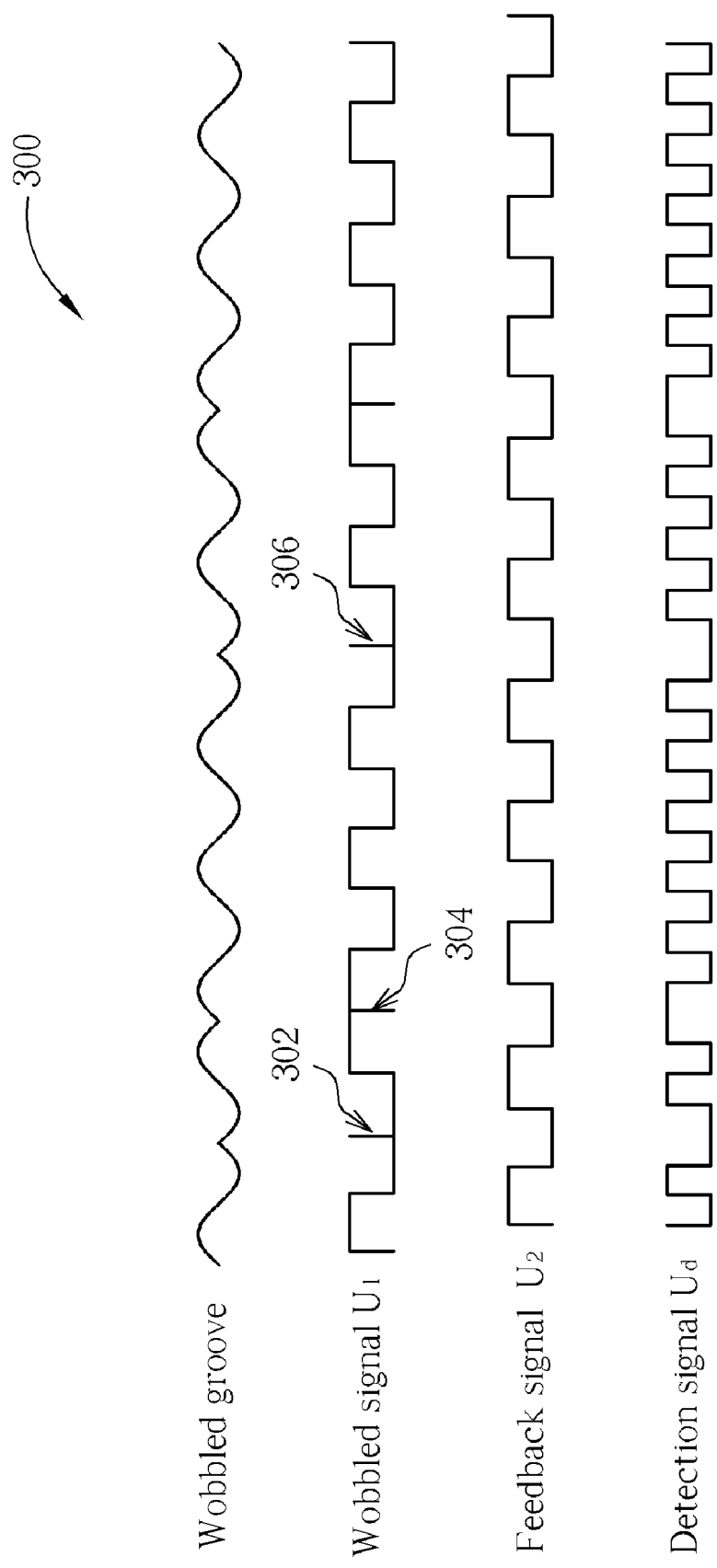
FIG. 3 is a timing diagram of a detector of FIG. 2 according to the present invention.

Please refer to FIG. 3, as well as FIG. 2. FIG. 3 is a timing diagram 300 for the detector 210 according to the present invention. As shown in FIG. 3, when the wobble signal $U_1$ and the feedback signal $U_2$ have the same logic state, the detector 210 changes its output, the detection signal $U_d$, to first detection state. When the wobble signal $U_1$ and the feedback signal $U_2$ do not have the same logic state, the detector 210 changes the detection signal $U_d$ to a second detection state. In one embodiment, for example, the first detection state of the detection signal $U_d$ corresponds to logic 0 while the second detection state of the detection signal $U_d$ corresponds to logic 1.

As mentioned above, the detector 210 performs the XOR operation on the wobble signal $U_1$ and the feedback signal $U_2$, SO that it has no significant response to the impulses 302, 304 or 306 etc. shown in FIG. 3. Obviously, in contrast to the related art, the detector 210 of the present invention has better noise immunity.

As mentioned above, the filter 230 operates based on the control signal generated from the signal mixer 220. In one embodiment, the control signal of the PLL 200 of the present invention can be a combination of an up signal Up_mix and a down signal Dn_mix. In this case, the charge pump 232 performs a charge operation when the up signal Up_mix is enabled; performs a discharge operation when the down signal Dn_mix is enabled; and does not perform charge or discharge operation when both the up signal Up_mix and the down signal Dn_mix are disabled. In another embodiment, the control signal is a signal with three states. In this embodiment, for example, the charge pump 232 performs a charge operation when the control signal is 5V; performs a discharge operation when the control signal is 2.5V; and does not perform charge or discharge operation when the control signal is 0V.

Please refer back to FIG. 2. In a preferred embodiment, the signal mixer 220 comprises an XOR gate 222 for generating a mixing signal Mix_clk according to the mixing reference signal Mix_ref and a polarity-select signal Pol_sel; an AND gate 224 electrically connected to the XOR gate 222 for generating the up signal Up_mix according to the detection signal $U_d$ and the mixing signal Mix_clk; and a NOR gate 226 electrically connected to the XOR gate 222 for generating the down signal Dn_mix according to the detection signal $U_d$ and the mixing signal Mix_clk. The mixing signal has a first mixing state and a second mixing state. In this embodiment, for example, the first mixing state corresponds to logic 0 while the second mixing state corresponds to logic 1. The operation of the signal mixer 220 is described in the following.

Figure 4:
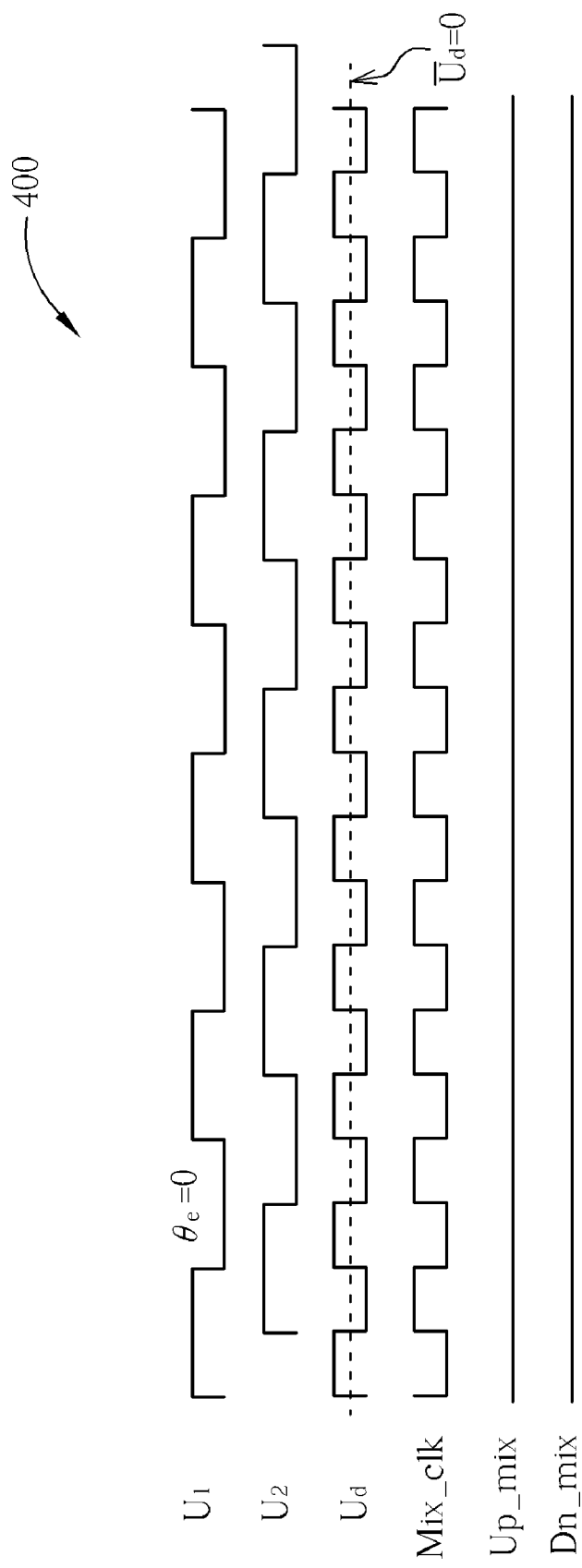
FIG. 4 and FIG. 5 are timing diagrams of a signal mixer according to the present invention.

Please refer to FIG. 4, which shows a timing diagram 400 for the signal mixer 220 according to the present invention. In the timing diagram 400, it is assumed that no phase error exists between the wobble signal $U_1$ and the feedback signal $U_2$, i.e., $\theta_e=0$. In addition, for convenience, the duty cycle of the wobble signal $U_1$ is herein assumed to be 50%. In an ideal locked situation of the PLL 200, the wobble signal $U_1$ and the feedback signal $U_2$ are quadrature and have the same frequency (e.g., the wobble signal $U_1$ leads the feedback signal $U_2$ by 90 degrees shown in FIG. 4). When the PLL 200 is at a locked state, the detection signal $U_d$ generated from the detector 210 is twice the frequency of the feed back signal $U_2$, and is repeatedly alternated between the first detection state and the second detection state. As a result, the DC component $\overline{U_d}$ of the detection signal $U_d$ approaches 0. In this situation, the signal mixer 220 mixes the detection signal $U_d$ with the mixing signal Mix_clk with a phase difference of 180 degrees. Thus, as shown in FIG. 4, when the detection signal $U_d$ is at the second detection state (logic 1) while the mixing signal Mix_clk is at the first mixing state (logic 0), or the detection signal $U_d$ is at the first detection state (logic 0) while the mixing signal Mix_clk is at the second mixing state (logic 1), the up signal Up_mix and the down signal Dn_mix are both at the disable state (i.e., the logic 0 state in this embodiment). So that the charge pump 232 of the filter 230 does not perform charge or discharge operations. In other words, when the frequency of the wobble signal $U_1$ is close to the feedback signal Us, and there is no phase error between the two signals, i.e., $\theta_e=0$, the up signal Up_mix and the down signal Dn_mix are both at the disable state.

Figure 5:
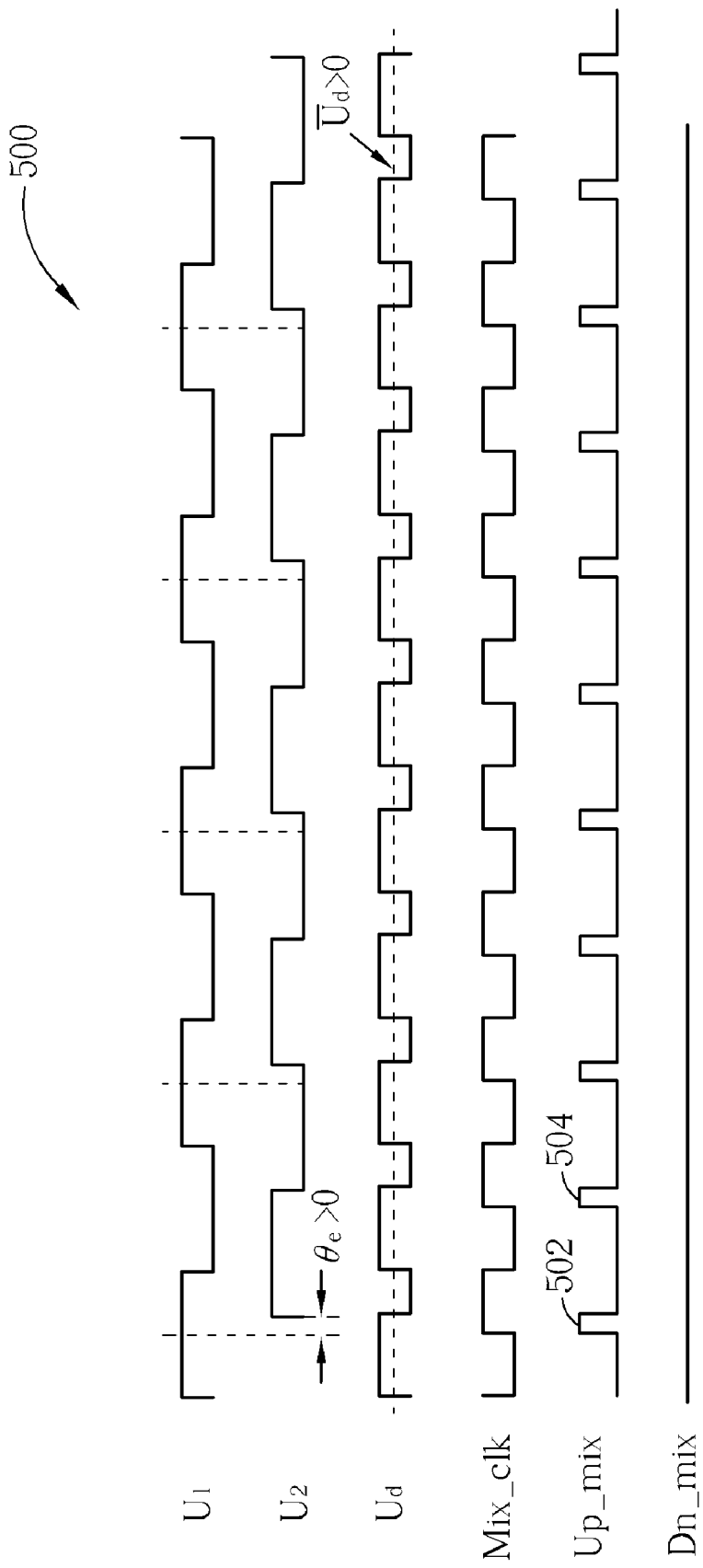

Please refer to FIG. 5, which shows another timing diagram 500 for the signal mixer 220 according to the present invention. In the timing diagram 500, the wobble signal $U_1$ and the feedback signal $U_2$ are assumed to have similar frequencies, but there is a phase error ($\theta_e>0$) between the two signals, so that the two signals are not quadrature. For example, as shown in FIG. 5, the feedback signal $U_2$ lags the wobble signal $U_1$ by over 90 degrees. As a result, the DC component of the detection signal $U_d$ is greater than 0. In this situation, impulses (such as pulses 502, 504, etc.) occur in the up signal Up_mix outputted from the signal mixer 220 by mixing the detection signal $U_d$ and the mixing signal Mix_clk. In other words, when the detection signal $U_d$ is at the second detection state (logic 1) while the mixing signal Mix_clk is at the second mixing state (logic 1), the up signal Up_mix is set to an enable state (e.g., the logic 1 state in this embodiment). So that the charge pump 232 of the filter 230 performs corresponding charge operation to drive the controllable oscillator 240 to increase the frequency of the write clock Write_clk. In other words, the signal mixer 220 enables the up signal Up_mix to drive the controllable oscillator 240 to increase the frequency of the write clock Write_clk when the feedback signal $U_2$ lags the wobble signal $U_1$ by more than 90 degrees.

On the contrary when the detection signal $U_d$ is at the first detection state (logic 0) while the mixing signal Mix_clk is at the first mixing state (logic 0), the down signal Dn_mix is set to an enable state (e.g., the logic 1 state in this embodiment). So that the charge pump 232 of the filter 230 performs corresponding discharge operation to drive the controllable oscillator 240 to lower the frequency of the write clock Write_clk. In other words, when the feedback signal $U_2$ leads the wobble signal $U_1$ by over 90 degrees, the DC component of the detection signal $U_d$, $\overline{U_d}$, is less than 0. In this situation, the signal mixer 220 enables the down signal Dn_mix to drive the controllable oscillator 240 to lower the frequency of the write clock Write_clk.

As the foregoing, in ideal situation, the wobble signal $U_1$ leads or lags the feedback signal $U_2$ by 90 degrees, and the detection signal $U_d$ is repeatedly alternated between the first detection state and the second detection state. In this situation, if the detection signal $U_d$ is directly employed to control the charge pump 232 of the filter 230, the charge pump 232 repeatedly performs unnecessary charge or discharge operations. In view of this, the signal mixer 220 of the present invention mixes the detection signal $U_d$ with the mixing signal Mix_clk, and then uses the generated up signal Up_mix or the down signal Dn_mix, which has a lower duty cycle, to control following stages in order to save the power consumed in the charge pump 232. As shown in FIG. 2, the signal mixer 220 uses the XOR gate 222 to adjust the polarity of the mixing reference signal Mix_ref to generate the mixing signal Mix_clk according to the polarity-select signal Pol_sel. In a preferred embodiment, the polarity-select signal Pol_sel is generated based on the lead/lag relationship between the two input signals of the detector 210 (i.e., the wobble signal $U_1$ and the feedback signal $U_2$). The detailed operation will be discussed later.

Figure 6:
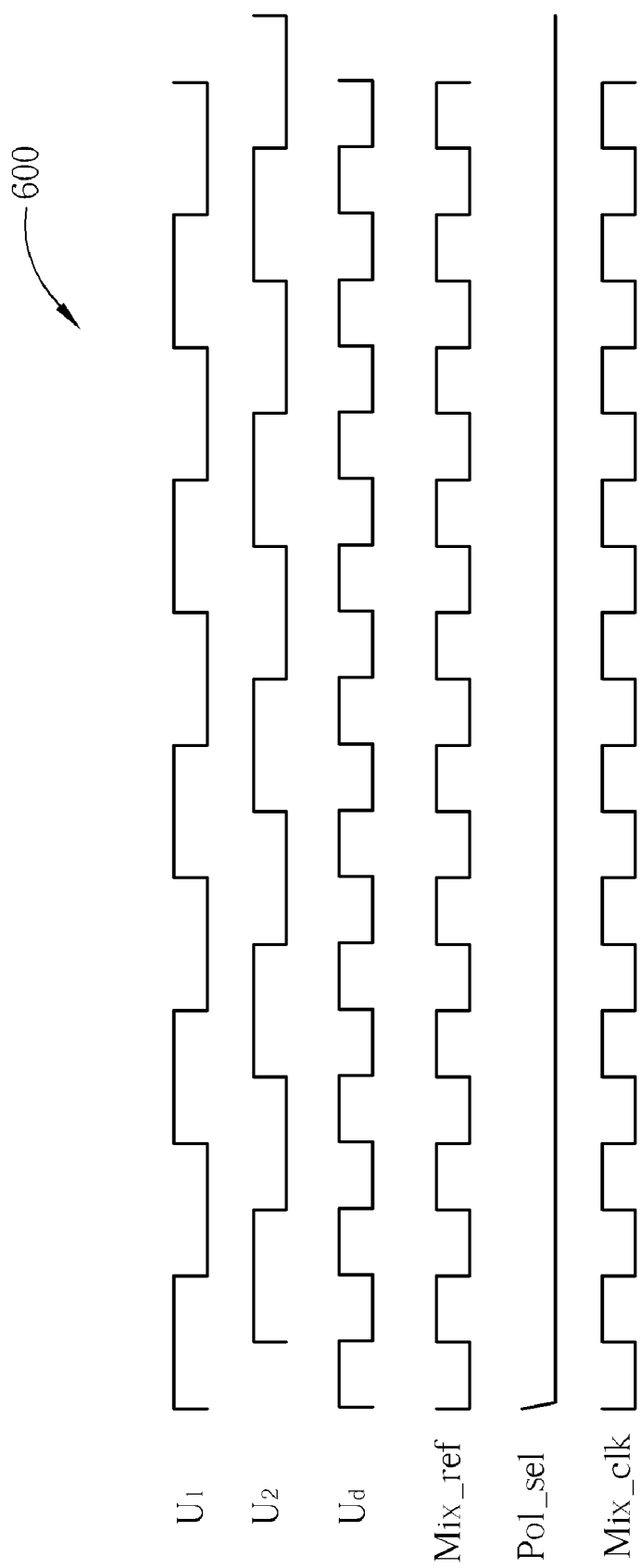
FIG. 6 and FIG. 7 are timing diagrams of the signal mixer when generates a mixing signal according to the present invention.
Figure 7:
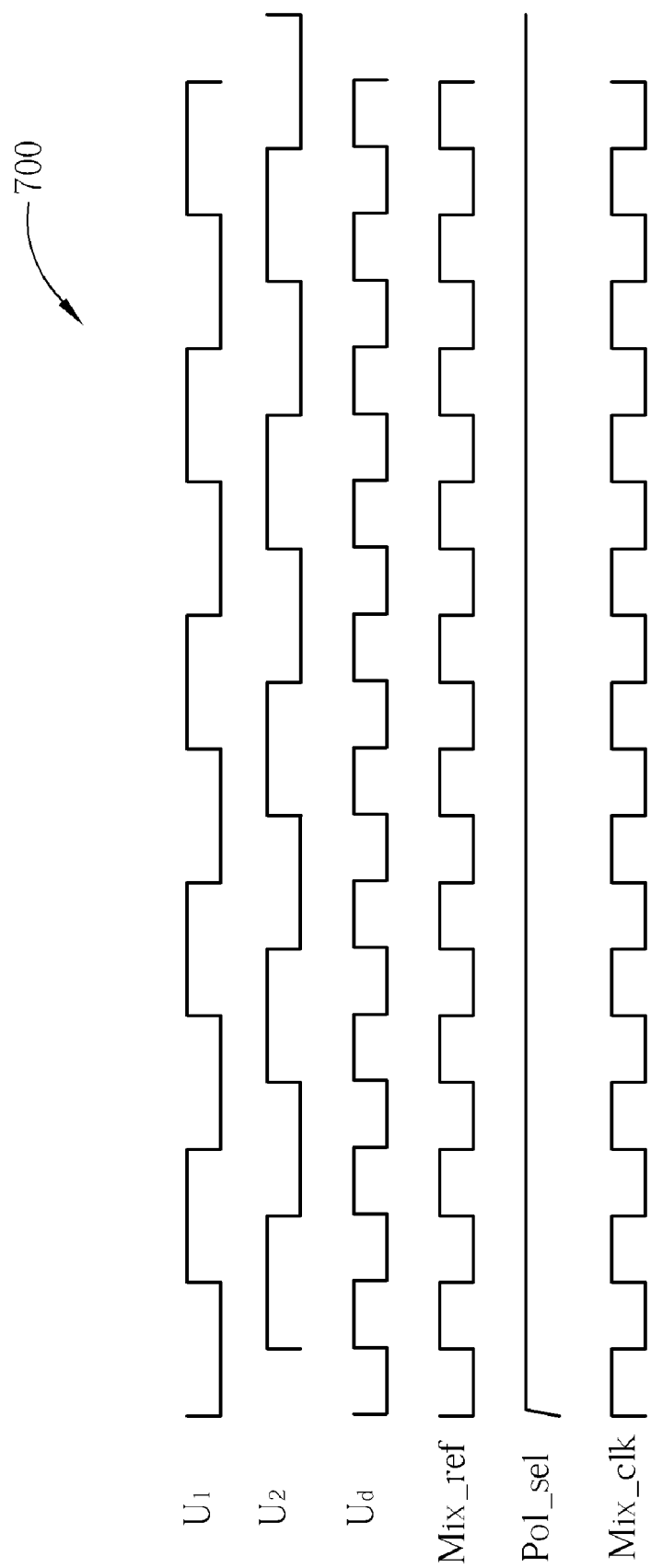

Please refer to FIG. 6 and FIG. 7, as well as FIG. 2. FIG. 6 and FIG. 7 are different timing diagrams representing the signal mixer 200 generating the mixing signal Mix_clk using the polarity-select signal Pol_sel according to the present invention. In a timing diagram 600 of FIG. 6, it is assumed that the wobble signal $U_1$ leads the feedback signal $U_2$ by 90 degrees when the PLL 200 is locked. As mentioned above, the mixing reference signal Mix_ref is twice the frequency of the feedback signal $U_2$. The waveform of the mixing reference signal Mix_ref is shown in FIG. 6. It is known from FIG. 2, in order to make the phase of the mixing signal Mix_clk outputted from the XOR gate 222 differ from the detection signal $U_d$ by 180 degrees, the polarity-select signal Pol_sel should be set to logic 0 level. In a timing diagram 700 of FIG. 7, it is assumed that the wobble signal $U_1$ lags the feedback signal $U_2$ by 90 degrees when the PLL 200 is locked. In this case, in order to make the phase of the mixing signal Mix_clk outputted from the XOR gate 222 differ from the detection signal $U_d$ by 180 degrees, the polarity-select signal Pol_sel should be set to logic 1 level.

Figure 8:
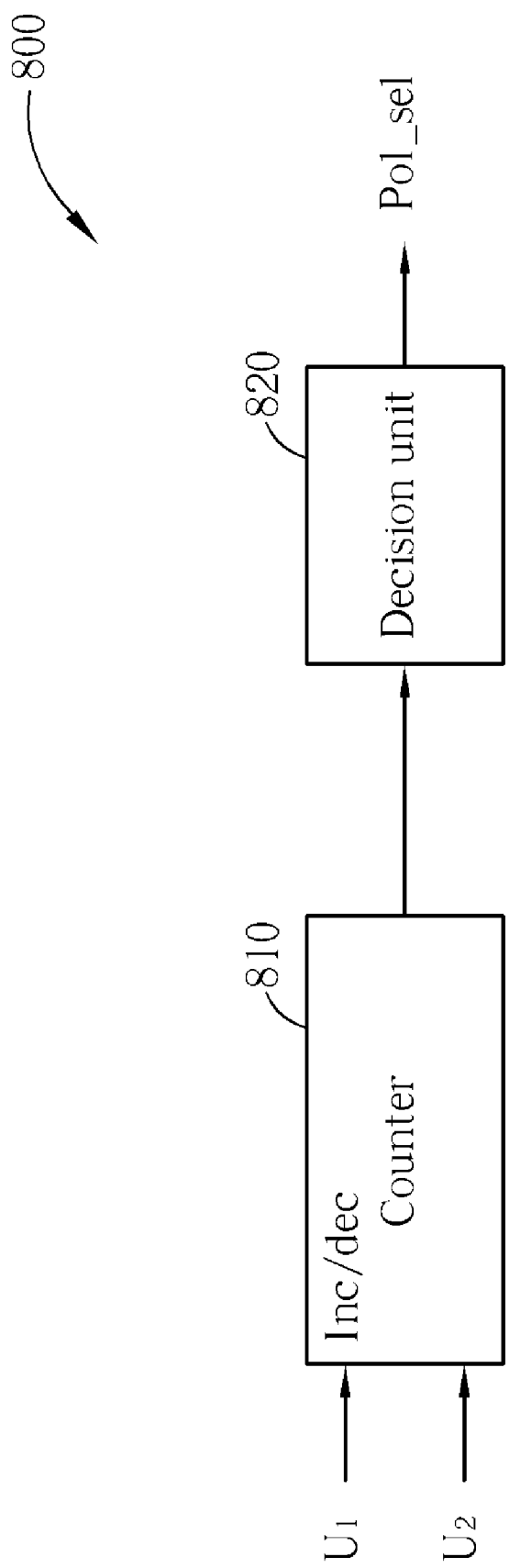
FIG. 8 is a functional block diagram of a first decision circuit for generating a polarity-select signal according to the present invention.

Please refer to FIG. 8, which shows a functional block diagram of a first decision circuit 800 for generating the polarity-select signal Pol_sel according to the present invention. The first decision circuit 800 comprises a counter 810 and a decision unit 820 electrically connected to the counter 810. In practice, the counter 810 can be used to count the logic value of the wobble signal $U_1$ when it is triggered by the positive edge of the feedback signal $U_2$ to generate a count value. The decision unit 820 then determines the phase relationship between the wobble signal $U_1$ and the feedback signal $U_2$ according to the count value to generate the polarity-select signal Pol_sel.

Figure 9:
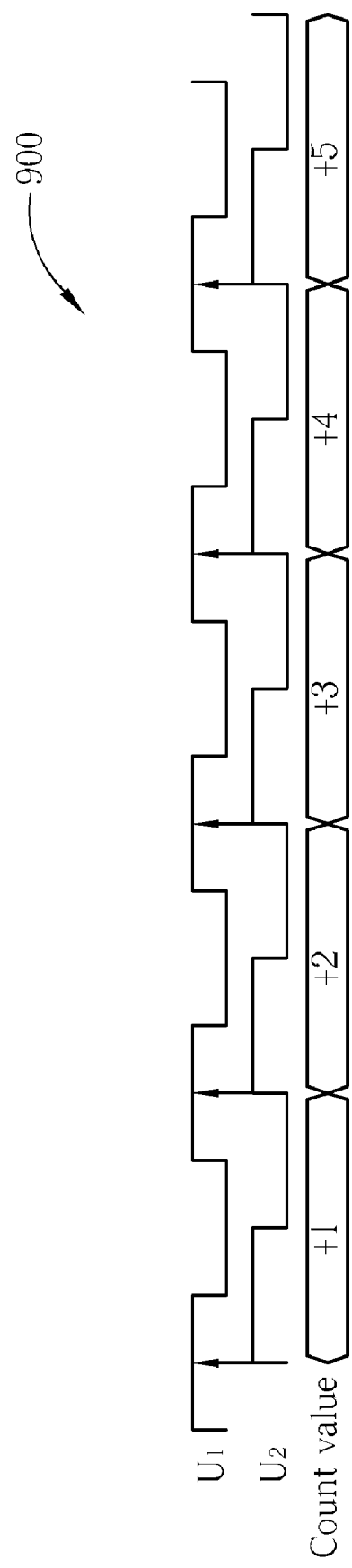
FIG. 9 and FIG. 10 are timing diagrams of the first decision circuit according to the present invention.
Figure 10:
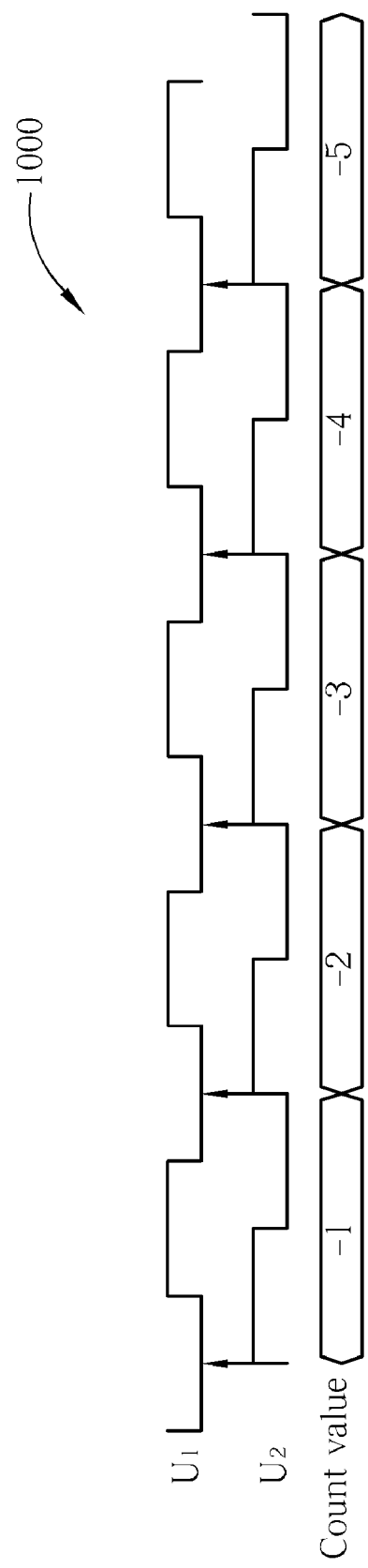

FIG. 9 and FIG. 10 are different timing diagrams of the first decision circuit 800 according to the present invention. In a timing diagram 900 of FIG. 9, it is assumed that the wobble signal $U_1$ leads the feedback signal $U_2$ by 90 degrees when the PLL 200 is locked. In this embodiment, the counter 810 of the first decision circuit 800 uses the feedback signal $U_2$ as a working clock. The counter 810 records the logic value of the wobble signal $U_1$ when it is triggered by the positive edge of the feedback signal $U_2$ to generate the count value. For example, if the wobble signal is at logic 1, the count value is increased by 1; on the contrary, if the wobble signal is at logic 0, the count value is decreased by 1. When the count value is accumulated to a first threshold value (e.g., +4), the decision unit 820 determines that the wobble signal $U_1$ leads the feedback signal $U_2$ accordingly. Therefore, the decision unit 820 sets the polarity-select signal Pol_sel to a corresponding logic state, e.g., logic 0.

In a timing diagram 1000 of FIG. 10, it is assumed that the wobble signal $U_1$ lags the feedback signal $U_2$ by 90 degrees when the PLL 200 is locked. Similarly, the counter 810 uses the feedback signal $U_2$ as a working clock and records the logic value of the wobble signal $U_1$ when it is triggered by the positive edge of the feedback signal $U_2$ to generate the count value. When the count value is accumulated to a second threshold value (e.g., −4), the decision unit 820 determines that the wobble signal $U_1$ lags the feedback signal $U_2$. Accordingly, the decision unit 820 sets the polarity-select signal Pol_sel to another corresponding logic state, e.g., logic 1.

In practical implementations, the counter 810 can alternatively use the wobble signal $U_1$ as a working clock. Additionally, the counter 810 is not necessarily limited to count in the positive edge of its working clock of the present invention.

In another embodiment, moreover, the PLL 200 decides the logic level of the polarity-select signal Pol_sel according to the up signal Up_mix and the down signal Dn_mix. From FIG. 4 and FIG. 5, it is known that if the polarity-select signal Pol_sel is correct, the duty cycle of the up signal Up_mix or the down signal Dn_mix generated by mixing the mixing signal Mix_clk and the detection signal $U_d$ will not be too high. This is also one of the purposes of the signal mixer 220. However, suppose that the PLL 200 of the present invention does not utilize the first decision circuit 800 to decide the logic level of the polarity-select signal Pol_sel, it may cause error in the polarity of the mixing signal Mix_clk with the result that the up signal Up_mix and the down signal Dn_mix are alternately enabled to cause following stages to operate incorrectly.

Figure 11:
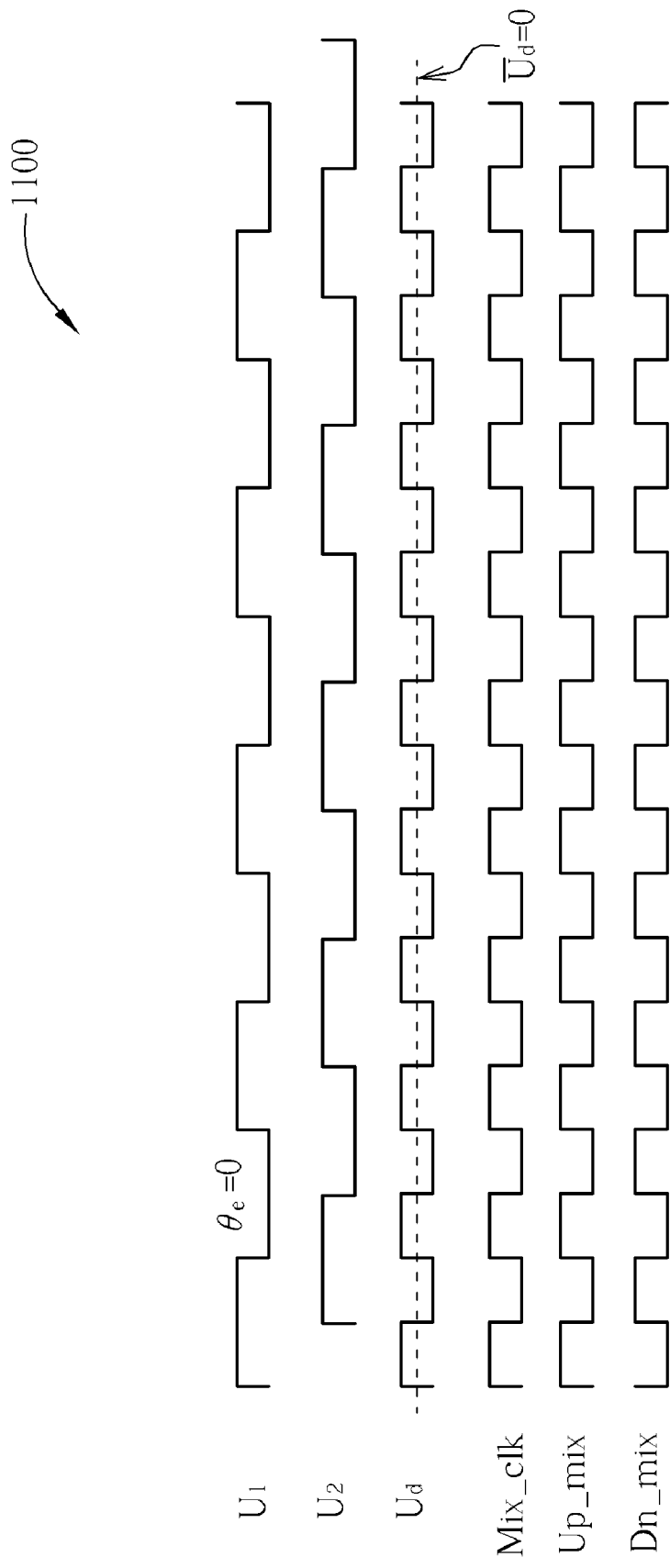
FIG. 11 is a timing diagram of an incorrect polarity-select signal.

For example, FIG. 11 shows a timing diagram 1100 for the mixing signal with incorrect polarity. In the timing diagram 1100, similar to the timing diagram 400 of FIG. 4, the DC component of the detection signal $U_d$ is 0. The difference between the two timing diagrams is that the polarity of the mixing signal Mix_clk shown in the timing diagram 1100 is incorrect, so that the up signal Up_mix and the down signal Dn_mix are alternately switched into enable state. As a result, the charge pump 232 of the filter 230 in the following stage performs redundant charge or discharge operations.

Figure 12:
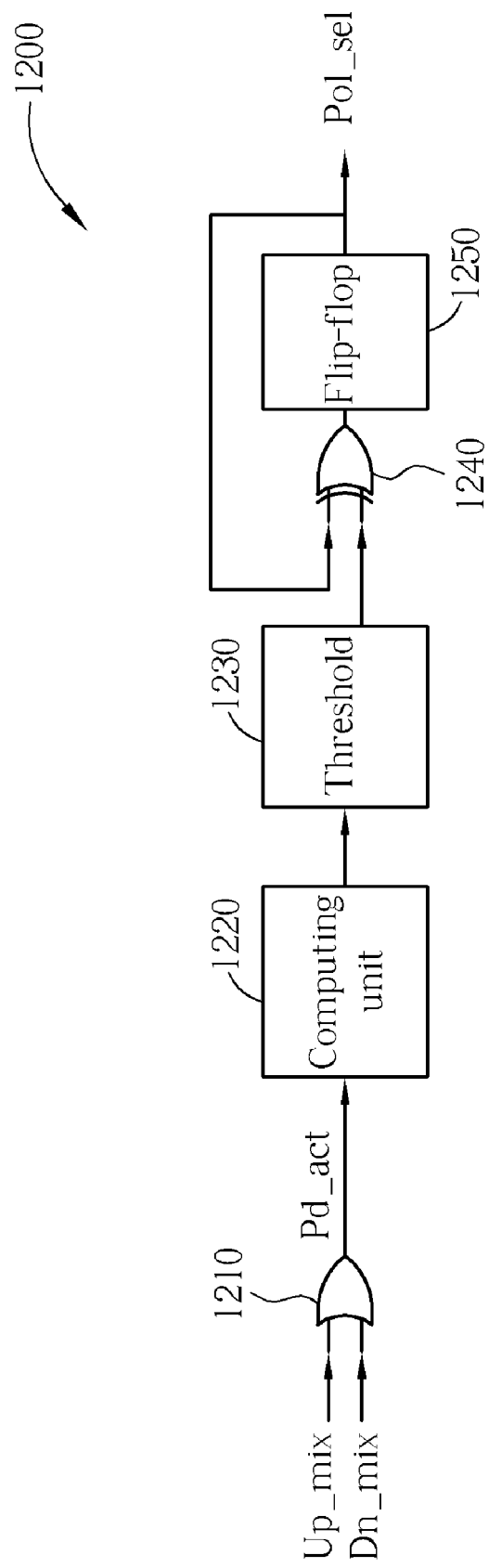
FIG. 12 is a functional block diagram of a second decision circuit for generating the polarity-select signal according to the present invention.

Thus, the PLL 200 of the present invention can decide the correct logic state of the polarity-select signal Pol_sel according to the feedback of the up signal Up_mix and the down signal Dn_mix. Please refer to FIG. 12, which shows a functional block diagram of a second decision circuit 1200 for generating the polarity-select signal according to the present invention. The second decision circuit 1200 comprises an OR gate 1210 for generating an indication signal Pd_act according to the up signal Up_mix and the down signal Dn_mix; a computing unit 1220 for computing the average duty cycle of the indication signal Pd_act; a threshold 1230 for determining whether the computed result obtained by the computing unit 1220 is greater than a predetermined threshold value (e.g., 30%); an XOR gate 1240; and a flip-flop 1250. According to the above illustrations of the timing diagrams 400, 500 and 1100, it is known that the second decision circuit 1200 is able to determine the correctness of the logic state of the polarity-select signal Pol_sel (i.e., the correctness of the polarity of the mixing signal Mix_clk) by comparing the predetermined threshold value and the average duty cycle of the indication signal Pd_act.

In practice, the PLL 200 of the present invention can use only one of the first decision circuit 800 and the second decision circuit 1200 to decide the polarity-select signal Pol_sel, and can also use both of them to further ensure the correctness of the mixing signal Mix_clk.

Figure 13:
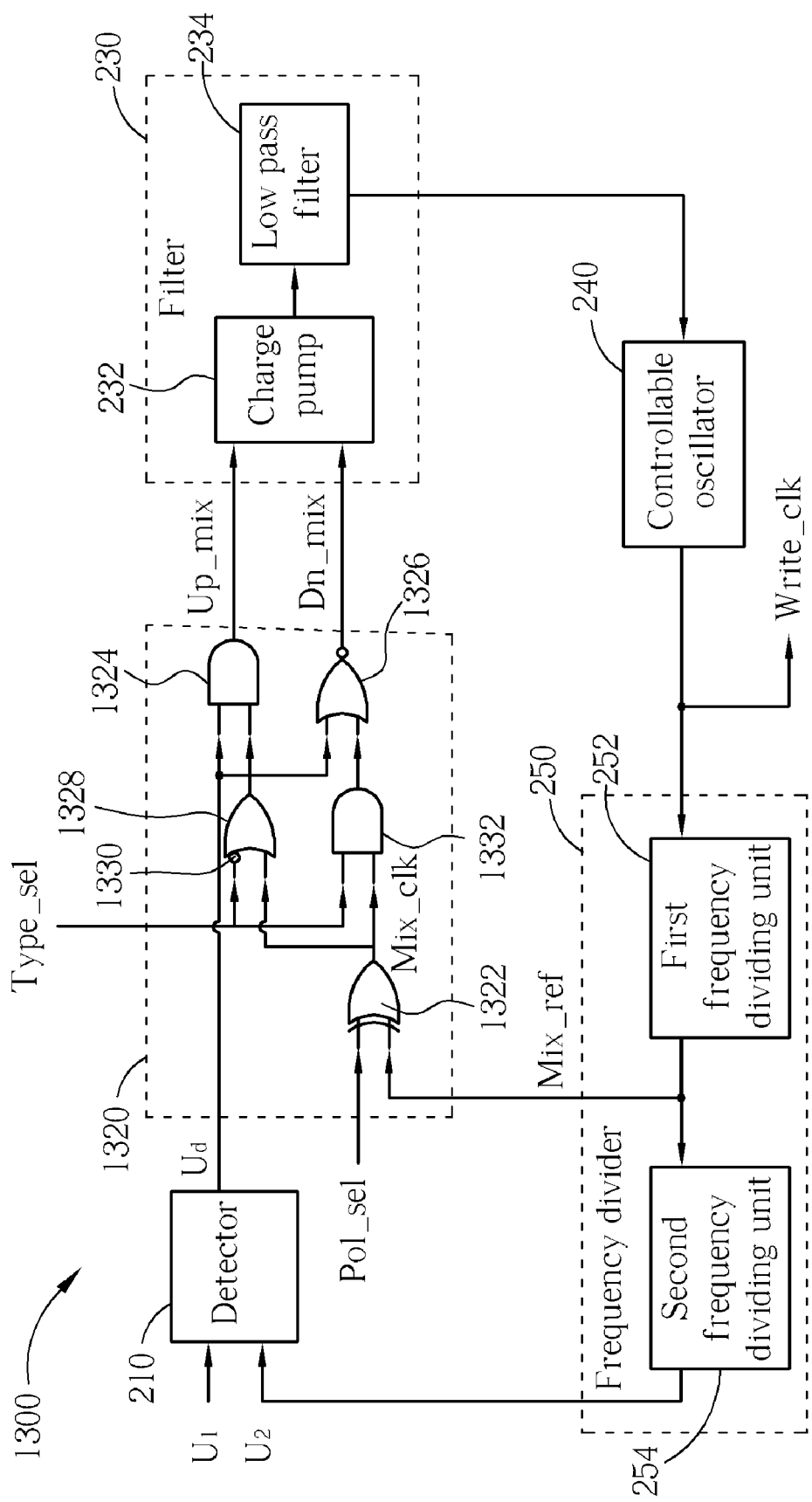
FIG. 13 is a schematic diagram of a PLL according to the second embodiment of the present invention.

Please refer to FIG. 13, which shows a schematic diagram of a PLL 1300 according to the second embodiment of the present invention. The PLL 1300 is similar to the PLL 200 shown in FIG. 2, so that the same components are labeled the same way. The major difference between the two PLLs is that a signal mixer 1320 of the PLL 1300 has one more mode-selection function than the signal mixer 220 of FIG. 2, so that the signal mixer 1320 is able to be switched between different operation modes according to a mode-select signal Type_sel. For example, the signal mixer 1320 is switched to a first operation mode when the mode-select signal Type_sel at a disable state, and is switched to a second operation mode when the mode-select signal Type_sel at an enable state. In one embodiment, the enable state of the mode-select signal Type_sel corresponds to logic 1 while the disable state corresponds to logic 0.

FIG. 14 shows a truth table 1400 of the signal mixer 1320 of FIG. 13 according to the present invention. When the mode-select signal Type_sel is at the disable state, i.e., the signal mixer 1320 is switched to the first operation mode, and the up signal Up_mix and the down signal Dn_mix outputted from the signal mixer 1320 only relate to the detection signal $U_d$ outputted from the detector 210. For example, in one embodiment, if the signal mixer 1320 operates in the first operation mode, the signal mixer 1320 enables the up signal Up_mix when the detection signal $U_d$ is at the second detection state (logic 1), and enables the down signal Dn_mix when the detection signal $U_d$ is at the first detection state (logic 0).

On the other hand, when the mode-select signal Type_sel is at the enable state, i.e., the signal mixer 1320 is switched to the second operation mode, the up signal Up_mix and the down signal Dn_mix outputted from the signal mixer 1320 are determined by both the detection signal $U_d$ and the mixing signal Mix_clk. For example, in this embodiment, if the signal mixer 1320 operates in the second operation mode, the signal mixer 1320 enables the up signal Up_mix when the detection signal $U_d$ is at the second detection state (logic 1) while the mixing signal Mix_clk is at the second mixing state (logic 1), and enables the down signal Dn_mix when the detection signal $U_d$ is at the first detection state (logic 0) while the mixing signal Mix_clk is at the first mixing state (logic 0). Additionally, in both the situations of that the detection signal $U_d$ is at the first detection state (logic 0) while the mixing signal is at the second mixing state (logic 1) and that the detection signal $U_d$ is at the second detection state (logic 1) while the mixing signal is at the first mixing state (logic 0), the signal mixer 1320 sets both the up signal Up_mix and the down signal Dn_mix into the disable state.

Figure 15:
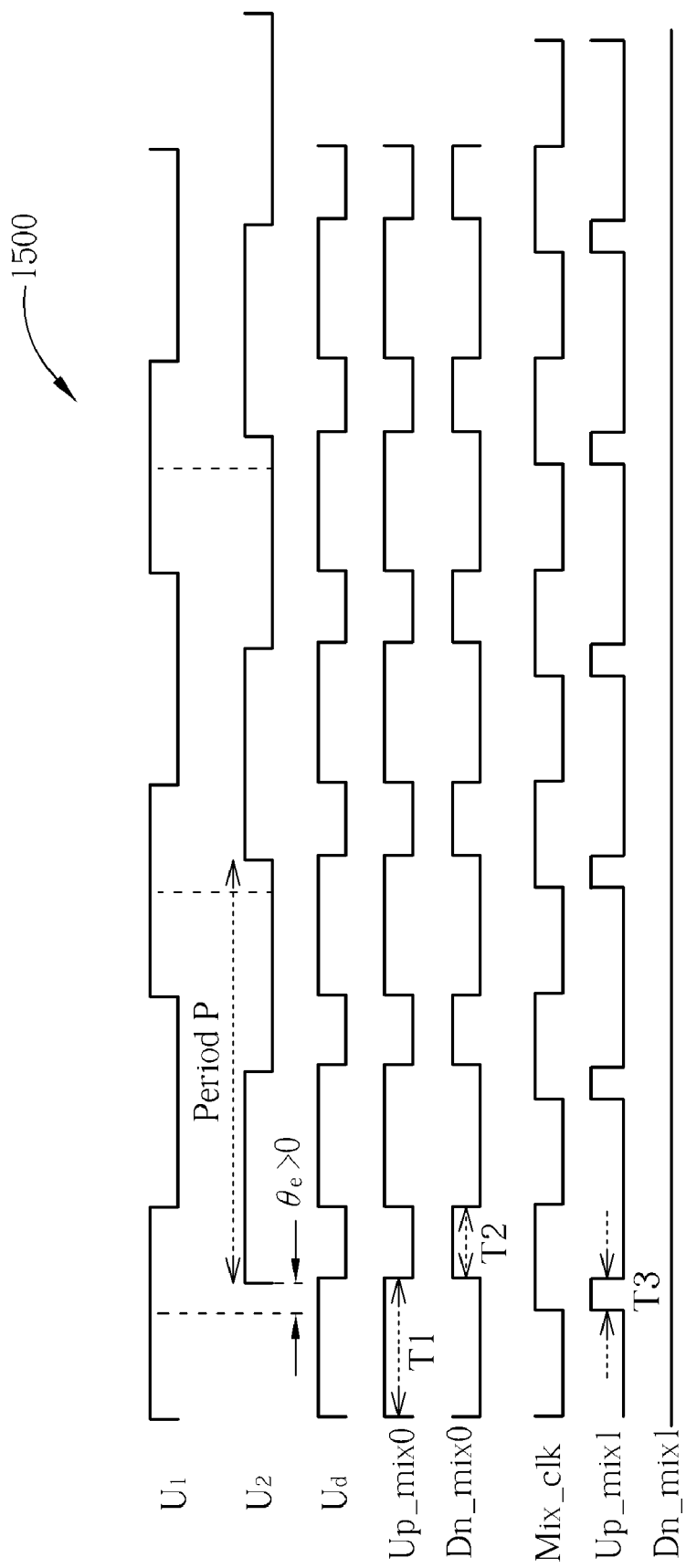
FIG. 15 is a timing diagram of a PLL of FIG. 13 according to the present invention.

Please refer to FIG. 15, which shows a timing diagram 1500 of the PLL 1300 of FIG. 13 according to the present invention. In the timing diagram 1500, the wobble signal $U_1$ and the feedback signal $U_2$ are assumed to have similar frequencies but there is a phase error ($\theta_e > 0$) between the two signals. For example, the feedback signal $U_2$ lags the wobble signal $U_1$ by over 90 degrees. In this situation, if the mode-select signal Type_sel is at the disable state, the signal mixer 1320 of the PLL 1300 operates in the first operation mode. The up signal Up_mix0 and the down signal Dn_mix0 generated by the signal mixer 1320 are alternately switched to the enable state with pulse widths of T1 and T2, respectively. On the other hand, if the mode-select signal Type_sel is at the enable state, the signal mixer 1320 of the PLL 1300 operates in the second operation mode. In both the up signal Up_mix1 and the down signal Dn_mix1 are generated from the signal mixer 1320, only the up signal Up_mix1 has active pulses with a pulse width of T3.

As is well known in the art, the active pulses of the up signal Up_mix0 and the down signal Dn_mix0 cause the opposite effect in the following stages. The active pulse of the up signal Up_mix0 causes the charge pump 232 to perform a charge operation, and the active pulse of the down signal Dn_mix0 causes the charge pump 232 to perform a discharge operation. As shown in the timing diagram 1500, if the signal mixer 1320 operates in the first operation mode, the effect of a part of the pulse of the up signal Up_mix0 will be balanced by the pulse of the down signal Dn_mix0, so that the active pulse width is $T1-T2=(P/2+P*\theta_e)-(P/2-P*\theta_e)=2*P*\theta_e$, wherein P is the period of the feedback signal $U_2$. If the signal mixer 1320 operates in the second operation mode, the pulse width T3 of the up signal Up_mix1 is $P*\theta_e$.

According to above illustration, it is known that the output of the signal mixer 1320 in the first operation mode causes twice the effect in the following stages than that of the second operation mode. However, as mentioned above, when the signal mixer 1320 operates in the second operation mode, it mixes the detection signal $U_d$ with the mixing signal Mix_clk, so that the jitter situation of the output of the controllable oscillator 240 is improved. Therefore, the PLL 1300 of the present invention can be switched between the two operation modes in order to obtain optimal performance. For example, before the PLL 1300 is locked, the mode-select signal Type_sel can be set to the disable state, so that the signal mixer 1320 operates in the first operation mode to increase the response speed of the PLL 1300. After the PLL 1300 is locked or the jitter situation of the output of the controllable oscillator 240 below a predetermined criteria, the PLL 1300 can set the mode-select signal Type_sel to the enable state, so that the signal mixer 1320 operates in the second operation mode to improve the signal quality of the write clock Write_clk generated from the controllable oscillator 240.

Figure 16:
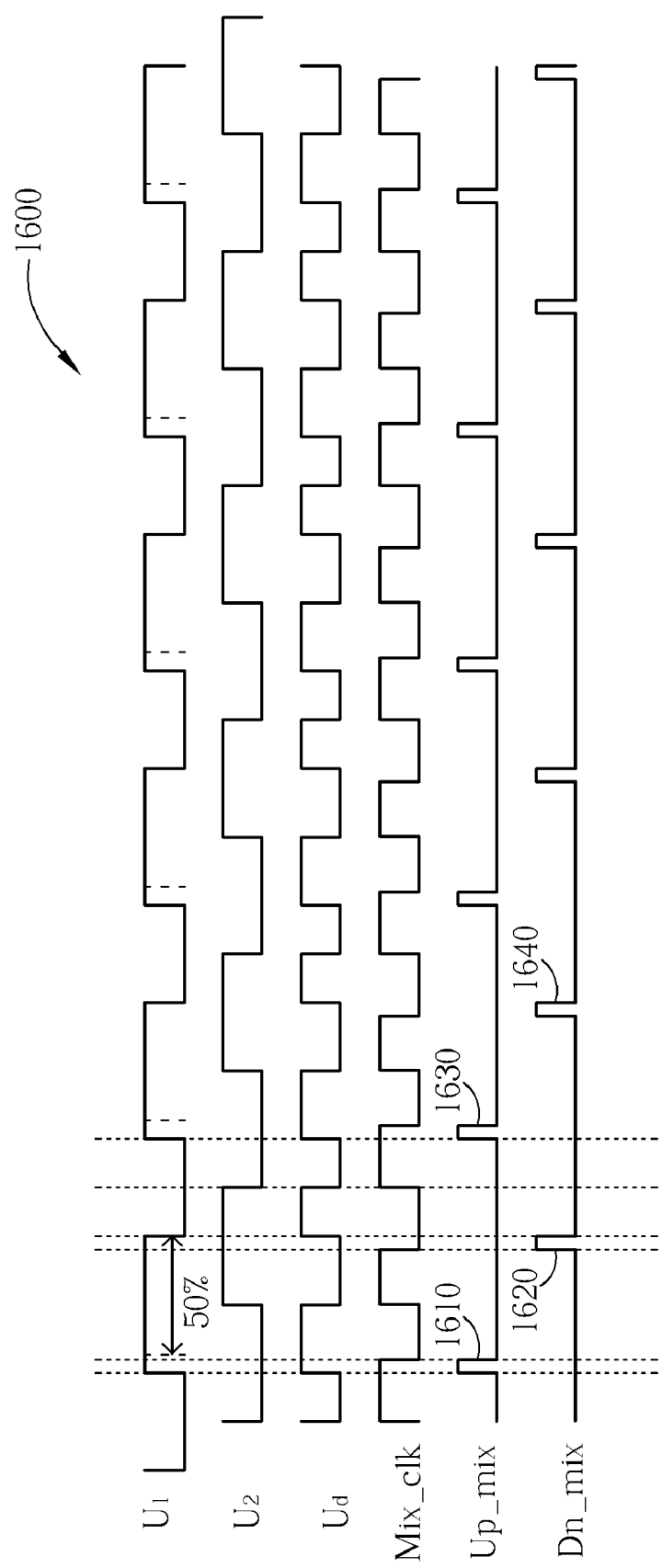
FIG. 16 is a timing diagram of a wobble signal whose duty cycle is greater than 50%.

In practical implementations, the duty cycle of the wobble signal $U_1$ input to the detector 210 may not be 50% as well as above embodiments. Please refer to FIG. 16, which shows a timing diagram 1600 corresponding to a wobble signal $U_1$ whose duty cycle is greater than 50%. In the timing diagram 1600, since the feedback signal $U_2$ and the mixing signal Mix_clk are generated from the controllable oscillator 240, the duty cycle of the two signals is close to 50%. However, the duty cycle of the wobble signal $U_1$ is not ideal, so that redundant active pulses, such as the pulses 1610,1620,1630, and 1640 etc, shown in the timing diagram 1600, occur in the up signal Up_mix and the down signal Dn_mix. It is obvious that the pulse 1620 balances the effect of the pulse 1610, and the pulse 1640 also balances the effect of the pulse 1630. In other words, if the duty cycle of the wobble signal is not the ideal 50%, the signal mixer 220 or 1320 of the present invention generates some unnecessary control signals and results in unnecessary power consumption in following stages. Therefore, the PLL 200 or 1300 of the present invention can adjust the duty cycle of the wobble signal $U_1$ to an ideal ratio using analog or digital techniques to improve energy efficiency.

Figure 17:
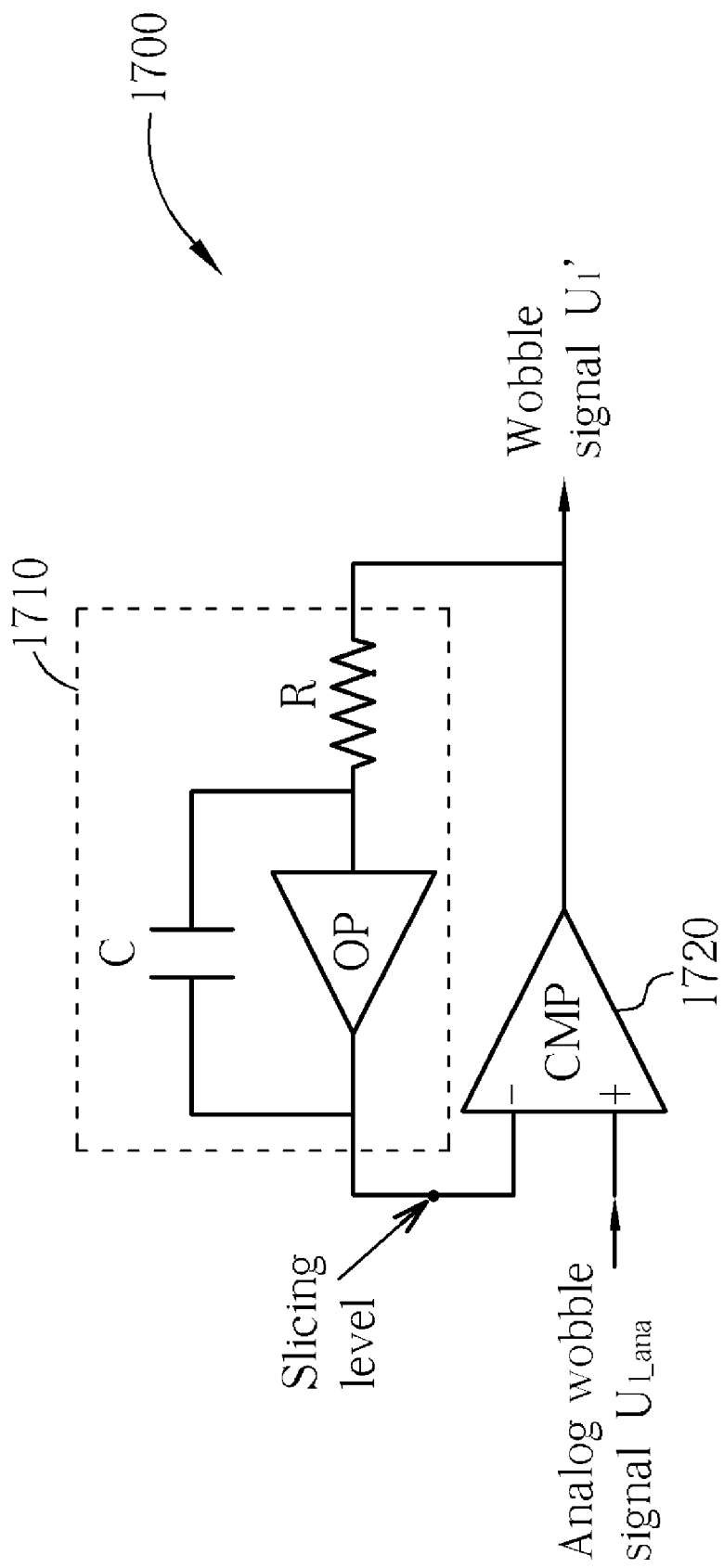
FIG. 17 through FIG. 19 are schematic diagrams of different adjusting circuits for adjusting the duty cycle of the wobble signal according to the present invention.

For example, FIG. 17 shows a schematic diagram of an adjusting circuit 1700 for adjusting the duty cycle of the wobble signal according to one embodiment of the present invention. The adjusting circuit 1700 comprises an integrator 1710 and a comparator 1720 electrically connected to the integrator 1710. The comparator 1720 is used for processing an analog wobble signal $U_{1\_ana}$ extracted from a push-pull signal according to a slicing level to generate an adjusted wobble signal $U_1'$. The integrator 1710 then uses a feedback control method to adjust the slicing level according to the adjusted wobble signal $U_1'$, so that the duty cycle of the adjusted wobble signal $U_1'$ generated from the adjusting circuit 1700 approaches the predetermined ratio, 50%.

Figure 18:
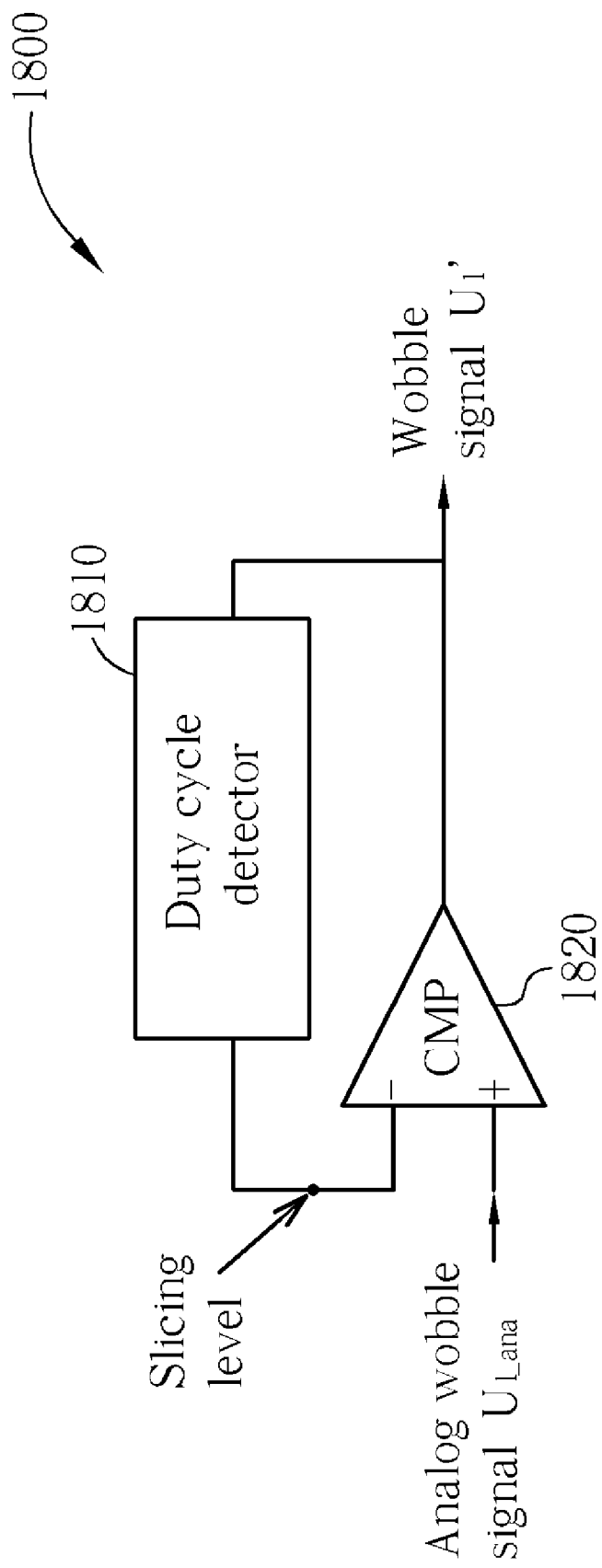

FIG. 18 shows a schematic diagram of an adjusting circuit 1800 according to another embodiment of the present invention. The adjusting circuit 1800 comprises a duty cycle detector 1810 and a comparator 1820 electrically connected to the duty cycle detector 1810. The comparator 1820 is used for processing the analog wobble signal $U_{1\_ana}$ according to a slicing level to generate an adjusted wobble signal $U_1'$. The duty cycle detector 1810 determines the duty cycle of the adjusted wobble signal $U_1'$ and then adjusts the slicing level according to the determined result.

Figure 19:
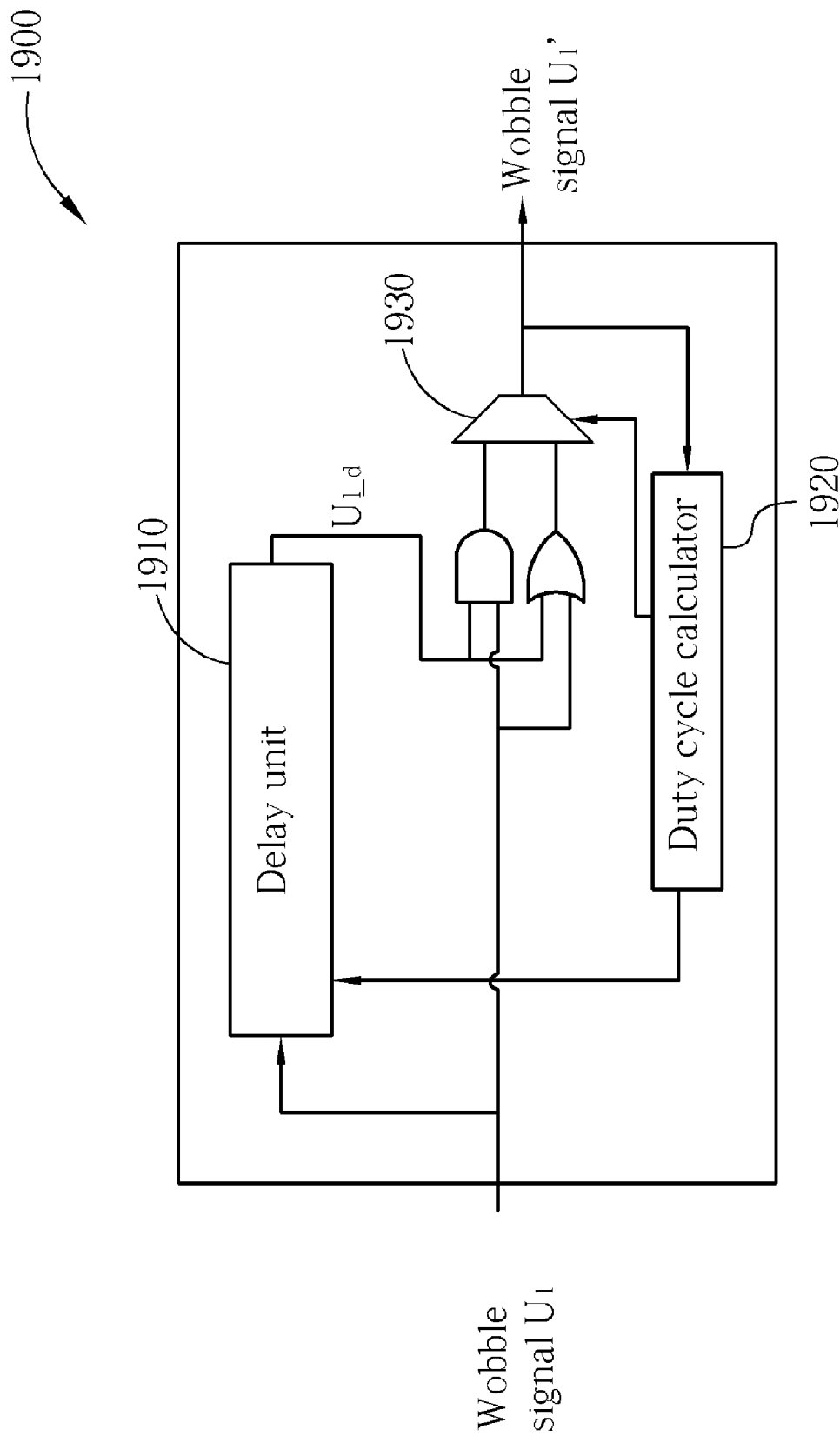

FIG. 19 shows a schematic diagram of a digital adjusting circuit 1900 according to the present invention. The adjusting circuit 1900 utilizes a duty cycle calculator 1920 to determine the duty cycle of the adjusted wobble signal $U_1'$. According to the determined result, the adjusting circuit 1900 controls a delay unit 1910 to generate a delayed wobble signal $U_{1\_d}$ by delaying the original wobble signal $U_1$. In addition, the duty cycle calculator 1920 further controls a multiplexer 1930 to selectively output the result of an AND logic operation for the original wobble signal $U_1$ and the delayed wobble signal $U_{1\_d}$ or the result of an OR logic operation for the two signals according to the duty cycle of the adjusted wobble signal $U_1'$, so that the duty cycle of the adjusted wobble signal $U_1'$ generated from the adjusting circuit 1900 approaches 50%.

Note that, in the foregoing description of the PLL of the present invention, the second frequency dividing unit 254 of the frequency divider 250 used for dividing the mixing reference signal Mix_ref by two to generate the feedback signal $U_2$ is just an embodiment. In practice, the second frequency dividing unit 254 can also be used for dividing the mixing reference signal Mix_ref by a divisor equal to or more than two. Similarly, the first frequency dividing unit 252 of the present invention is not limited to perform a division of 16. Furthermore, in the PLL of the present invention, if the signal generated from the controllable oscillator 240 is only required to be twice the frequency of the input signal of the PLL, the first frequency dividing unit 252 can be omitted or disabled.

As mentioned above, the PLL of the present invention has better noise immunity and does not operate incorrectly when the phase of the input signal is suddenly changed. Another advantage of the PLL of the present invention is that the operation mode of the PLL is adjustable according to the performance requirement to improve the response speed of the PLL.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A phase locked loop (PLL) for generating an output signal according to an input signal, the PLL comprising:
   a detector for generating a detection signal according to the difference between the input signal and a feedback signal;
   a signal mixer electrically connected to the detector for generating a control signal according to the detection signal and a mixing reference signal having a higher frequency than the frequency of the feedback signal;
   a filtering device electrically connected to the signal mixer for generating an adjust signal according to the control signal;
   a controllable oscillator electrically connected to the filtering device for generating the output signal according to the adjust signal; and a frequency divider electrically connected to the controllable oscillator for generating the feedback signal and the mixing reference signal according to the output signal;

wherein the output signal is at least twice the frequency of the input signal.

2. The PLL of claim 1, wherein the input signal is a wobble signal.

3. The PLL of claim 1, wherein the frequency of the mixing reference signal is at least twice the frequency of the feedback signal.

4. The PLL of claim 1, wherein the detector outputs the detection signal at a first detection state if the logic value of the input signal is the same as that of the feedback signal; and outputs the detection signal at a second detection state if the logic value of the input signal is different from that of the feedback signal.

5. The PLL of claim 4, wherein the signal mixer generates a mixing signal according to the mixing reference signal, and the mixing signal has a first mixing state and a second mixing state.

6. The PLL of claim 5, wherein the signal mixer outputs the control signal at an up-enable state if the detection signal is at the second detection state and the mixing signal is at the second mixing state; and outputs the control signal at an down-enable state if the detection signal is at the first detection state and the mixing signal is at the first mixing state.

7. The PLL of claim 5, wherein the signal mixer outputs the control signal at a disable state if the detection signal is at the second detection state and the mixing signal is at the first mixing state or if the detection signal is at the first detection state and the mixing signal is at the second mixing state.

8. The PLL of claim 5, wherein the signal mixer further adjusts the polarity of the mixing signal in accordance with the situation of phase leading/lagging between the input signal and the feedback signal.

9. The PLL of claim 5, wherein the signal mixer further adjusts the polarity of the mixing signal according to the control signal.

10. The PLL of claim 5, wherein the signal mixer is switched between a first operation mode and a second operation mode based on the performance requirement of the PLL.

11. The PLL of claim 10, wherein when the signal mixer operates in the first operation mode, the signal mixer outputs the control signal at an up-enable state if the detection signal is at the second detection state and outputs the control signal at a down-enable state if the detection signal is at the first detection state.

12. The PLL of claim 10, wherein when the signal mixer operates in the second operation mode, the signal mixer outputs the control signal at an up-enable state if the detection signal is at the second detection state and the mixing signal is at the second mixing state; the signal mixer outputs the control signal at a down-enable state if the detection signal is at the first detection state and the mixing signal is at the first mixing state; and the signal mixer outputs the control signal at a disable state if the detection signal is at the second detection state and the mixing signal is at the first mixing state or if the detection signal is at the first detection state and the mixing signal is at the second mixing state.

13. The PLL of claim 1, further comprising an adjusting circuit electrically connected to the detector for adjusting the duty cycle of the input signal to approach a predetermined ratio.

14. An optical storage device for generating a writing clock according to a wobble signal, the optical storage device comprising:

a detector for generating a detection signal according to the difference between the wobble signal and a feedback signal;

a signal mixer electrically connected to the detector for generating a control signal according to the detection signal and a mixing reference signal having a higher frequency than the frequency of the feedback signal;

a filtering device electrically connected to the signal mixer for generating an adjust signal according to the control signal;

a controllable oscillator electrically connected to the filtering device for generating the writing clock according to the adjust signal; and a frequency divider electrically connected to the controllable oscillator for generating the feedback signal and the mixing reference signal according to the writing clock;

wherein the frequency of the mixing reference signal is at least twice the frequency of the feedback signal.

15. The optical storage device of claim 14, wherein the detector outputs the detection signal at a first detection state if the logic value of the wobble signal is the same as that of the feedback signal; and outputs the detection signal at a second detection state if the logic value of the wobble signal is different from that of the feedback signal.

16. The optical storage device of claim 15, wherein the signal mixer generates a mixing signal according to the mixing reference signal, wherein the mixing signal has a first mixing state and a second mixing state.

17. The optical storage device of claim 16, wherein the signal mixer outputs the control signal at an up-enable state if the detection signal is at the second detection state and the mixing signal is at the second mixing state; and outputs the control signal at an down-enable state if the detection signal is at the first detection state and the mixing signal is at the first mixing state.

18. The optical storage device of claim 16, wherein the signal mixer outputs the control signal at a disable state if the detection signal is at the second detection state and the mixing signal is at the first mixing state or if the detection signal is at the first detection state and the mixing signal is at the second mixing state.

19. The optical storage device of claim 16, wherein the signal mixer further adjusts the polarity of the mixing signal in accordance with the situation of phase leading/lagging between the wobble signal and the feedback signal.

20. The optical storage device of claim 16, wherein the signal mixer further adjusts the polarity of the mixing signal according to the control signal.

21. The optical storage device of claim 16, wherein the signal mixer is switched between a first operation mode and a second operation mode based on the performance requirement of the optical storage device.

22. The optical storage device of claim 21, wherein when the signal mixer operates in the first operation mode, the signal mixer outputs the control signal at an up-enable state if the detection signal is at the second detection state and outputs the control signal at a down-enable state if the detection signal is at the first detection state.

23. The optical storage device of claim 21, wherein when the signal mixer operates in the second operation mode, the signal mixer outputs the control signal at an up-enable state if the detection signal is at the second detection state and the mixing signal is at the second mixing state; the signal mixer outputs the control signal at a down-enable state if the detection signal is at the first detection state and the mixing signal is at the first mixing state; and the signal mixer outputs the control signal at a disable state if the detection signal is at the second detection state and the mixing signal is at the first mixing state or if the detection signal is at the first detection state and the mixing signal is at the second mixing state.

24. The optical storage device of claim 14, further comprising an adjusting circuit electrically connected to the detector for adjusting the duty cycle of the wobble signal to approach a predetermined ratio.

* * * * *